United States Patent [19]
Osanai

[11] Patent Number: 6,140,183
[45] Date of Patent: Oct. 31, 2000

[54] METHOD OF FABRICATING SEMICONDUCTOR DEVICE

[75] Inventor: Jun Osanai, Chiba, Japan

[73] Assignee: Seiko Instruments Inc., Japan

[21] Appl. No.: 09/217,118

[22] Filed: Dec. 21, 1998

[51] Int. Cl.[7] .................................. H01L 21/336
[52] U.S. Cl. .................... 438/268; 438/286; 438/304; 438/305
[58] Field of Search .................... 438/300, 301, 438/303, 304, 306, 305, 163, 230, 286, 268; 257/346, 387

[56] References Cited

U.S. PATENT DOCUMENTS

| | | | |
|---|---|---|---|
| 4,757,032 | 7/1988 | Contiero | 438/268 |
| 5,397,715 | 3/1995 | Miller | 438/627 |
| 5,444,002 | 8/1995 | Yang | 438/268 |
| 5,677,224 | 10/1997 | Kadosh et al. | 437/57 |
| 5,705,439 | 1/1998 | Chang | 438/286 |
| 5,786,252 | 7/1998 | Ludikhuize et al. | 438/257 |
| 5,970,329 | 10/1999 | Cha | 438/197 |

*Primary Examiner*—Donald L. Monin, Jr.
*Assistant Examiner*—Hoai Pham
*Attorney, Agent, or Firm*—Adams & Wilks

[57] ABSTRACT

A method of fabricating a semiconductor device an object of which is to form a semiconductor device having a DMOS with high withstanding pressure and high driving capacity and a highly precise polycrystalline silicon resistor. In the method of fabricating a semiconductor device, by patterning a second polycrystalline silicon resistor using anisotropic etching, the size precision is improved. Further, during the patterning, side spacers are formed on gate electrode side walls formed of first polycrystalline silicon at the same time. The body of the DMOS is doped with the gate electrode and the spacers being the mask. A source region is doped with the gate electrode being the mask after the spacers are removed.

16 Claims, 2 Drawing Sheets

METHOD OF FABRICATING SEMICONDUCTOR DEVICE

BACKGROUND OF THE INVENTION

The present invention relates to a method of fabricating a semiconductor device, and more particularly, a semiconductor device having on the same semiconductor substrate a DMOS with high driving capacity and a resistor circuit using a highly precise polycrystalline silicon resistor.

A conventional fabrication method is described using FIGS. 2(a)–2(b). After a gate oxide film 102 having a thin film thickness and a field oxide film 103 having a thick film thickness are formed on a semiconductor substrate 101 of a first conduction of conductivity type, a gate electrode 104 of a MOS transistor is formed of first polycrystalline silicon, and further, oxidization is carried out to form an oxide film 105, which is shown in FIG. 2(a). Next, as shown in FIG. 2(b), in an attempt to form a so-called body region (an impurity region 108 of a second conduction type) of the DMOS, impurity of the second conduction type is doped in the semiconductor substrate 101 of the first conduction type by ion implantation with the gate electrode 104 being the mask, and is diffused by thermal annealing. Then, as shown in FIG. 2(c), second polycrystalline silicon is adhered, impurity is doped, and thereafter, patterning is carried out to form a resistor 106. Next, as shown in FIG. 2(d), first impurity having high concentration is heavily doped in the semiconductor substrate 101, the second impurity region 108, and a part of the second polycrystalline silicon resistor 106 to form a source and a drain 110 and 110 of the MOS transistor and a junction with wiring metal after the resistor. In particular, if the conductivity type of the impurity is the same as that of the second polycrystalline silicon resistor, as shown in FIG. 2(d), a photoresist film 112 is patterned by photolithography. After that, with the photoresist 112 and the gate electrode 104 serving as a mask, the source 110 and the drain 110 of the MOS, the second polycrystalline silicon resistor 106 and a high concentration region 111 can be formed at the same time. The high concentration region 111 becomes an ohmic contact for attaching a wiring layer.

However, with the conventional fabrication method, in order to make high the punch-through withstanding pressure between the source and the drain of the DMOS, sufficient diffusion in the body region must be carried out, and nevertheless, there is a problem that, in this case, the effective L length of the DMOS becomes longer and thus, the sufficient driving capacity of the DMOS is not obtained. Further, while the resistor is formed using the second polycrystalline silicon, in patterning it, the etching is isotropic such that the etched residue, that is, stringer, of the second polycrystalline silicon resistor is not formed on the gate electrode side walls, and, there is also a problem that, here, since side etching is carried out, the precision of the value of resistance of the polycrystalline silicon resistor is made low.

An object of the present invention is to solve the above problems and to provide a fabrication method for forming on the same substrate a DMOS with sufficient withstanding pressure and high driving capacity and a polycrystalline silicon resistor with high precision of the value of resistance.

SUMMARY OF THE INVENTION

In order to solve the above problems, the present invention uses the following means.

(1) A method of fabricating a semiconductor device comprising the steps of: forming an oxide film on a semiconductor substrate of a first conduction type; forming a gate electrode on the above oxide film using a first polycrystalline silicon; oxidizing the above first polycrystalline silicon gate electrode; adhering a second polycrystalline silicon film onto the above oxide film; doping an impurity in the above second polycrystalline silicon film; by anisotropically etching the above second polycrystalline silicon film, patterning the second polycrystalline silicon film and forming spacers formed of the second polycrystalline silicon film on side walls of the first polycrystalline silicon gate electrode; introducing an impurity of a second conduction type into the semiconductor substrate of the above first conduction type with the above first polycrystalline silicon gate electrode and the second. polycrystalline silicon spacers being the mask; diffusing the impurity of the above second conduction type by thermal annealing; selectively removing, by etching, only the above second polycrystalline silicon spacers on the above first polycrystalline silicon gate electrode side walls; and doping impurity of the above first conduction type in the semiconductor substrate of the first conduction type and the impurity region of the above second conduction type.

(2) A method of fabricating a semiconductor device, characterized in that the film thickness of the above second polycrystalline silicon is from 500 Å to 4000 Å.

A semiconductor device according to a fabrication method of the present invention is capable of having a DMOS with sufficient withstanding pressure and high driving capacity, and a highly precise polycrystalline silicon resistor.

EMBODIMENT OF THE INVENTION

An embodiment of the present invention is described in the following based on a sectional view of FIG. 1 illustrating the order of processes.

Figure 1A:
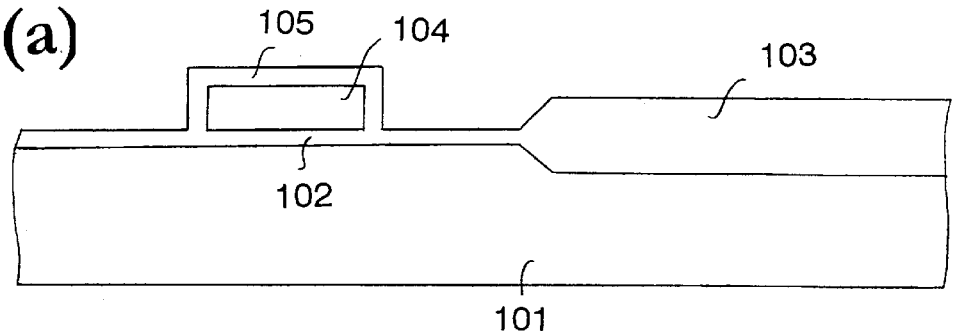
FIG. 1(a)–FIG. 1(e) are sectional views in the order of processes illustrating a method of fabricating a semiconductor device according to the present invention.

In FIG. 1(a), by the so-called LOCOS method, a field oxide film 103 having a thick film thickness and a gate oxide film 102 having a thin film thickness are formed on a semiconductor substrate 101 of a first conduction type, and a first polycrystalline silicon film to be a gate electrode 104 later is adhered onto the gate oxide film 102 by CVD (Chemical Vapor Deposition) so as to have a thickness of 3000 to 4000 Å. Phosphorus as an impurity element is doped at the rate of about $1 \times 10^{20}$ atoms/cm$^3$ by ion implantation or by an impurity diffusion furnace, the gate electrode 104 is patterned by photolithography and dry etching, and further, an oxide film 105 having the thickness of about 100 Å to 500 Å is formed by thermal oxidation.

Figure 1B:
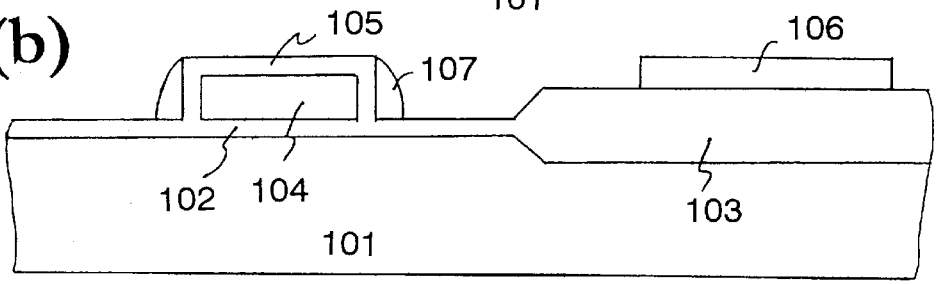

In FIG. 1(b), second polycrystalline silicon film having the film thickness of about 500 Å to 4000 Å is adhered by CVD or sputtering, and further, in an attempt to obtain a desired value of resistance of the sheet, phosphorus which is an N type impurity or boron which is a P type impurity is doped by ion implantation, and after that, a resistor pattern 106 is formed by photolithography and dry etching. During this dry etching, by highly anisotropic dry etching, for example, by using chlorine gas as the etchant, side spacers 107 formed of the second polycrystalline silicon are formed on side walls of the first polycrystalline silicon gate electrode 104 at the same time. In this case, the width of each of the side spacers 107 depends on the film thickness of the second polycrystalline silicon film and is about 0.1 μm to 0.3 μm . Further, by using highly anisotropic etching, no side etching is carried out, and thus, there is also the advantage that the precision of the size of the second polycrystalline silicon resistor pattern 106 is extremely good and a highly precise resistance can be formed.

Figure 1C:
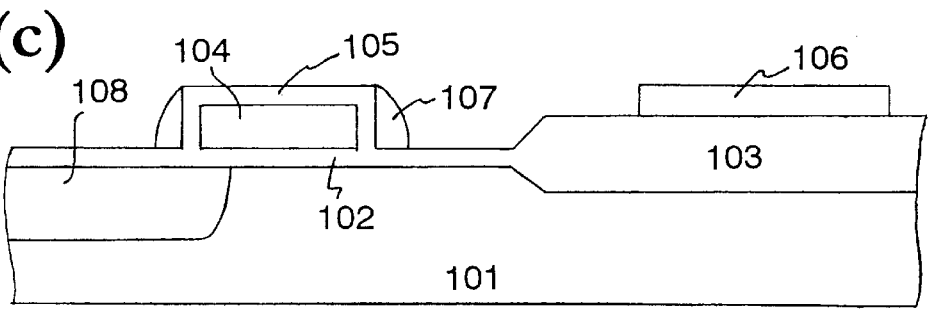

Next, as shown in FIG. 1(c), by ion implantation, impurity of the opposite conduction type to that of the semiconductor substrate 101 is doped in the semiconductor substrate 101 with the first polycrystalline silicon gate electrode 104, the side spacers 107 formed of the second polycrystalline silicon, and a photoresist being the mask. Further, diffusion is carried out by thermal annealing to form a so-called body region 108 of the DMOS. In this case, as the dopant, phosphorus is used when the semiconductor substrate 101 is of the P type, while boron is used when the semiconductor substrate 101 is of the N type. Though the dose and the thermal annealing for the diffusion partly depend on the operating voltage of the DMOS, the dose is about $1 \times 10^{13}$ to $5 \times 10^{14}$ atoms/cm$^2$ and the diffusion is carried out for about several hours with the temperature being in the range of 1000° C. to 1100° C.

Figure 1D:
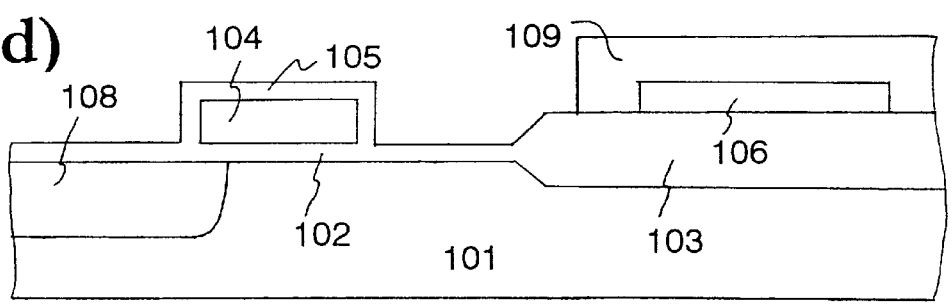

Next, as shown in FIG. 1(d), by photolithography, the photoresist 109 is patterned so as to cover the second polycrystalline silicon resistor 106. After that, by dry etching, the side spacers 107 on the side walls of the gate electrode 104 are removed. Here, the etching is relatively easy if isotropic dry etching is used in which the selection ratio to the underlayer oxide film can be easily set and no stringer is formed, but of course, anisotropic etching with a high selection ratio to the oxide film can carry out this process. As isotropic etching gas, $CF_4$, $SF_4$, and the like can be given as examples.

Figure 1E:
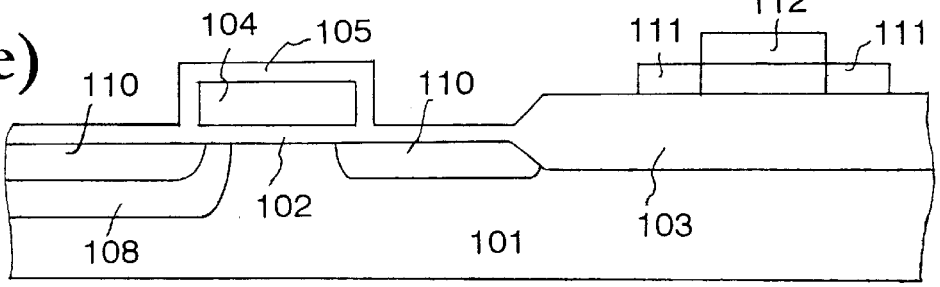
Figure 2A:
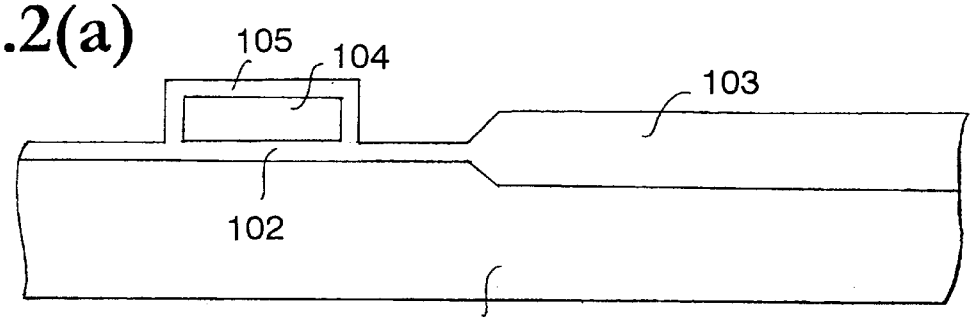
FIG. 2(a)–FIG. 2(d) are sectional views in the order of processes illustrating a conventional method of fabricating a semiconductor device.
Figure 2B:
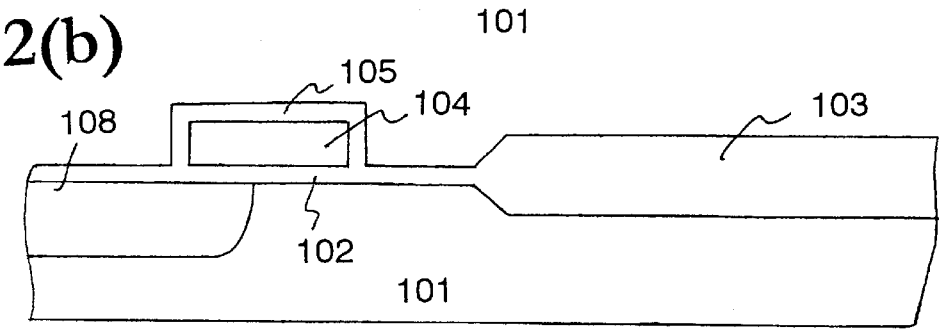
Figure 2C:
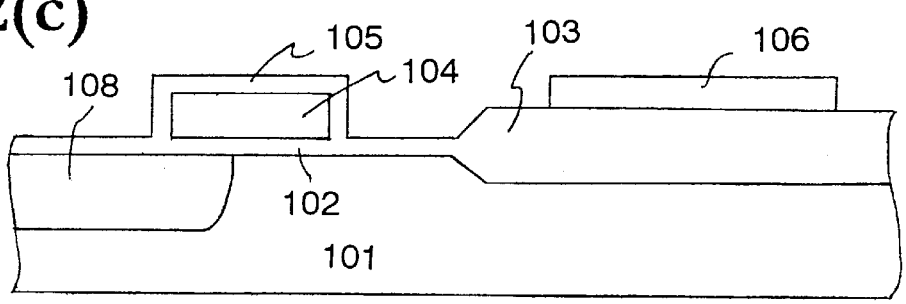
Figure 2D:
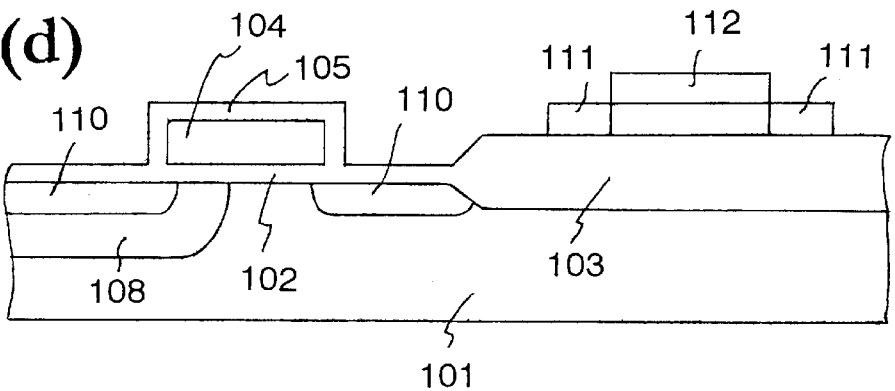

Next, in an attempt to form a source and a drain 110 of the MOS, impurity of the same conduction type as that of the semiconductor substrate 101 is doped by ion implantation. Here, if the conduction type of the impurity is the same as the conduction type of the second polycrystalline silicon resistor, as shown in FIG. 1(e), a photoresist 112 is patterned by photolithography. After that, with the photoresist 112 and the gate electrode 104 being the mask, the source 110 and the drain 110 of the MOS, the second polycrystalline silicon resistor 106 and a high concentration region 111 can be formed at the same time. The high concentration region 111 becomes a junction with wiring metal, after. If the conduction type of the second polycrystalline silicon resistor 106 is different from that of the semiconductor substrate 101 and of the source 110 and the drain 110 of the MOS, another doping is necessary. As the dopant, arsenic is used in case of the; N type and $BF_2$ ions are used in case of the P type. In this case, the dose is about $5 \times 10^{15}$ atoms/cm$^2$.

Since the L length of the DMOS according to the fabrication method of the present invention is shorter than the effective L length of the DMOS according to the conventional fabrication method by the width of the second polycrystalline silicon side spacers 107, the DMOS according to the fabrication method of the present invention has high driving capacity. For example, in the case where the effective L length of the DMOS according to the conventional fabrication method is 1.5μm and the side spacer width of the present invention is 0.3μm, the driving capacity is increased by about 25% per unit channel width. On the other hand, the withstanding pressure of the DMOS is predominantly determined by the punch-through due to the extension of a depletion layer from the drain side toward the body side at a relatively deep place in the body. In the DMOS according to the fabrication method of the present invention, since the body width is shorter than that of the conventional one only near the surface of the DMOS and the impurity profile and the width is the same as those of the conventional one relatively deep in the DMOS, the withstanding pressure remains the same as that according to the conventional method.

The fabrication method of a semiconductor device according to the present invention is described in the above. When a CMOS and a DMOS are formed in the same semiconductor substrate, sometimes a relatively deep well region of the opposite conduction type to that of the semiconductor substrate is made to be the drain region of the DMOS. The present invention can also be easily applied to that case. Further, in that case, the source and the drain of the MOS and the high concentration region in which junctions between the drain and the metal of the resistor can be formed at the same time for whichever the conduction type of the polycrystalline silicon resistor is of the P type or of the N type.

As described in the above, a semiconductor device according to the fabrication method of the present invention is capable of having a DMOS with sufficient withstanding pressure and high driving capacity and a highly precise polycrystalline silicon resistor.

What is claimed is:

1. A method of fabricating a semiconductor device having a DMOS transistor, comprising the steps of:

forming a first oxide film on a semiconductor substrate of a first conductivity type;

forming a gate electrode of the DMOS transistor on the oxide film using a first polycrystalline silicon film;

oxidizing the polycrystalline silicon gate electrode;

depositing a second polycrystalline silicon film onto the first oxide film;

doping an impurity into the second polycrystalline silicon film;

anisotropically etching the second polycrystalline silicon film, and patterning the second polycrystalline silicon film to form spacers formed of the second polycrystalline silicon film on side walls of the polycrystalline silicon gate electrode;

forming a body region of the DMOS transistor comprising an impurity region of a second conductivity type by introducing an impurity having the second conductivity type into the semiconductor substrate of the first conductivity type with the polycrystalline silicon gate electrode and the second polycrystalline silicon spacers serving as a mask and a photoresist layer formed on the semiconductor substrate at a side of the gate electrode opposite the body region;

diffusing the impurity of the second conductivity type by thermal annealing;

selectively removing, by etching, the polycrystalline silicon spacers formed on the polycrystalline silicon side walls; and doping an impurity of the first conductivity type into the semiconductor substrate of the first conductivity type and the body region of the second conductivity type.

2. A method of fabricating a semiconductor device as claimed in claim 1; wherein the film thickness of the second polycrystalline silicon film is in the range of about 500 Å to 4000 Å.

3. A method of fabricating a semiconductor device as claimed in claim 1; wherein the steps of patterning the second polycrystalline silicon film and doping an impurity of the second conductivity type into the second polycrystalline silicon film include forming a thin film resistor having a desired resistance value on the semiconductor substrate.

4. A method of fabricating a semiconductor device according to claim 1; wherein the first polycrystalline silicon film is deposited by chemical vapor deposition.

5. A method of fabricating a semiconductor device according to claim 1; wherein the step of doping the second polycrystalline silicon film comprises doping phosphorus at the rate of about $1\times10^{20}$ atoms/cm$^3$ by one of ion implantation and an impurity diffusion furnace.

6. A method of fabricating a semiconductor device according to claim 1; wherein the step of oxidizing the polycrystalline silicon gate electrode comprises forming an oxide film having a thickness of about 100 Å to 500 Å.

7. A method of fabricating a semiconductor device according to claim 1; further comprising the step of patterning the second polycrystalline silicon film to form a resistor pattern.

8. A method of fabricating a semiconductor device according to claim 1; wherein the width of the side spacers is within the range of about 0.1 μm to 0.3 μm.

9. A method of fabricating a semiconductor device having a DMOS transistor, comprising the steps of:

forming a first oxide film on a semiconductor substrate;

forming a gate electrode of the DMOS transistor on the first oxide film;

forming a second oxide film on the gate electrode;

depositing a polycrystalline silicon film onto the first oxide film;

patterning the polycrystalline silicon film using an anisotropic etching process to form spacers on side walls of the gate electrode;

forming a body region of the DMOS transistor by introducing a first impurity having a conductivity type opposite that of the semiconductor substrate into the semiconductor substrate using the gate electrode and one of the spacers as a mask, so that the body region is formed at only one side of the gate electrode;

diffusing the first impurity by thermal annealing;

removing the spacers formed on the gate electrode side walls; and doping a second impurity having the same conductivity type as the semiconductor substrate into the semiconductor substrate on opposite sides of the gate electrode so that the second impurity is doped into the body region and into the semiconductor substrate on an opposite side of the gate electrode from the body region.

10. A method of fabricating a semiconductor device according to claim 9; further comprising the step of patterning the polycrystalline silicon film to form a resistor.

11. A method of fabricating a semiconductor device according to claim 9; wherein the film thickness of the polycrystalline silicon film is in the range of about 500 Å to 4000 Å.

12. A method of fabricating a semiconductor device according to claim 9; wherein the steps of patterning the polycrystalline silicon film and doping an impurity of the second conductivity type into the polycrystalline silicon film include forming a thin film resistor having a desired resistance value on the semiconductor substrate.

13. A method of fabricating a semiconductor device according to claim 9; wherein the polycrystalline silicon film is deposited by chemical vapor deposition.

14. A method of fabricating a semiconductor device according to claim 9; further comprising the step of doping the polycrystalline silicon film using phosphorus at the rate of about $1\times10^{20}$ atoms/cm$^3$ by one of ion implantation and an impurity diffusion furnace.

15. A method of fabricating a semiconductor device according to claim 9; wherein the step of forming a second oxide film comprises the step of oxidizing the gate electrode to form a gate oxide film having a thickness of about 100 Å to 500 Å.

16. A method of fabricating a semiconductor device according to claim 9; wherein the width of the side spacers is within the range of about 0.1 μm to 0.3 μm.

* * * * *